(12) United States Patent
Shimonishi et al.

(10) Patent No.: US 9,614,137 B2
(45) Date of Patent: Apr. 4, 2017

(54) LIGHT EMITTING DEVICE

(71) Applicant: TOYODA GOSEI CO., LTD., Kiyosu-shi (JP)

(72) Inventors: Shota Shimonishi, Kiyosu (JP); Shigeo Takeda, Kiyosu (JP); Tomohiro Miwa, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/937,466

(22) Filed: Nov. 10, 2015

(65) Prior Publication Data

US 2016/0133806 A1 May 12, 2016

(30) Foreign Application Priority Data

Nov. 11, 2014 (JP) ................. 2014-229270

(51) Int. Cl.
| | | |
|---|---|---|
| *H01L 33/00* | (2010.01) | |
| *H01L 33/60* | (2010.01) | |
| *H01L 33/64* | (2010.01) | |
| *H05K 1/11* | (2006.01) | |
| *H01L 33/62* | (2010.01) | |
| *H01L 33/52* | (2010.01) | |

(52) U.S. Cl.
CPC ............ *H01L 33/60* (2013.01); *H01L 33/644* (2013.01); *H05K 1/115* (2013.01); *H01L 33/52* (2013.01); *H01L 33/62* (2013.01); *H05K 2201/10106* (2013.01)

(58) Field of Classification Search
USPC ..... 257/98, E33.072, E25.02, E33.075, 100, 257/99
See application file for complete search history.

(56) References Cited

U.S. PATENT DOCUMENTS

| 7,812,360 B2 * | 10/2010 | Yano | ............... H01L 33/641 |
| | | | 257/100 |
| 2003/0032212 A1 * | 2/2003 | Wang | ............... H01L 33/60 |
| | | | 438/48 |
| 2003/0116769 A1 * | 6/2003 | Song | ............... H01L 25/0753 |
| | | | 257/79 |

(Continued)

FOREIGN PATENT DOCUMENTS

| JP | 2007-109701 A | 4/2007 |
| JP | 2009-182307 A | 8/2009 |
| JP | 2011-009298 A | 1/2011 |

OTHER PUBLICATIONS

Final Rejection of U.S. Appl. No. 14/450,132, filed Mar. 8, 2016.*

*Primary Examiner* — Telly Green

(74) *Attorney, Agent, or Firm* — McGinn IP Law Group, PLLC

(57) ABSTRACT

A light emitting device includes: a heat dissipative board; a wiring board which adheres and is fixed to the heat dissipative board and in which a through-hole is formed; a light-emitting element which is mounted on a front surface of the heat dissipative board which is exposed through the through-hole of the wiring board; a bonding wire which connects the light-emitting element and the wiring board; and a light-reflecting member which covers a surface of an inner peripheral wall of the through-hole excluding disposition places of the light-emitting element and the bonding wire.

12 Claims, 3 Drawing Sheets

(56) References Cited

U.S. PATENT DOCUMENTS

| | | | |
|---|---|---|---|
| 2007/0247855 A1* | 10/2007 | Yano | H01L 33/641 |
| | | | 362/294 |
| 2010/0320483 A1 | 12/2010 | Kadotani et al. | |
| 2012/0007112 A1 | 1/2012 | Yamada et al. | |
| 2015/0036349 A1* | 2/2015 | Tsuchiya | H01L 33/60 |
| | | | 362/294 |

* cited by examiner

LIGHT EMITTING DEVICE

CROSS-REFERENCE TO RELATED APPLICATION(S)

This application is based upon and claims the benefit of priority from Japanese Patent Application No. 2014-229270, filed on Nov. 11, 2014, the entire contents of which are incorporated herein by reference.

BACKGROUND

1. Field of the Invention

The present invention relates to a light emitting device, particularly to the light emitting device which includes a heat dissipative board, a wiring board adhering to and fixed to the heat dissipative board, a light-emitting element mounted on the heat dissipative board, and a bonding wire connecting the light-emitting element and the wiring board.

2. Description of the Related Art

JP-A-2007-109701 discloses a board for mounting a light-emitting element having a structure of bonding a wiring plate and a support member. In the wiring plate, a through-hole, for causing reflected light by the support member on which a light-emitting element is mounted, to be transmitted is formed. The light-emitting element is mounted on the support member just under the through-hole.

JP-A-2011-009298 discloses a light-emitting diode light source device which includes a base, an insulating plate, and a plurality of light-emitting diode elements. The base has thermal conductivity. The insulating plate has a surface on which a conductive pattern is formed, and is fixed to a surface of the base. The plurality of light-emitting diode elements is mounted on a mounting area of the surface of the base, which is exposed by a through-hole provided in the insulating plate.

JP-A-2009-182307 discloses a manufacturing method of a light-emitting element in which a light-emitting element is mounted on a board having conductor wiring, the light-emitting element and the conductor wiring are electrically connected to each other by using a conductive wire, and the light-reflecting resin is provided so as to bury a portion of the conductive wire when the light-reflecting resin is provided on the board so as to cause the light-reflecting resin which reflects light from the light-emitting element to surround the light-emitting element. Thus, absorption of light is suppressed by exposing the conductive wire as little as possible.

In the technology of JP-A-2007-109701, since a side surface of the light-emitting element faces an inner peripheral wall surface of the through-hole of the wiring plate, light emitted from the side surface side of the light-emitting element is absorbed by the surface of the inner peripheral wall of the through-hole of the wiring plate, and thus there is a problem in that light extraction efficiency is degraded.

In the technology of JP-A-2011-009298, since a side surface of the light-emitting diode element faces an inner peripheral wall surface of the through-hole of the insulating plate, light emitted from the side surface side of the light-emitting element is absorbed by the surface of the inner peripheral wall of the through-hole of the insulating plate, and thus there is a problem in that light extraction efficiency is degraded.

In the technology of JP-A-2009-182307, if a synthetic resin material having a low thermal expansion coefficient is used as light-reflecting resin, when the light-reflecting resin is heated by heat emitted from the light-emitting element, thermal stress of the light-reflecting resin is applied to the conductive wire (bonding wire) buried in the light-reflecting resin, and thus there is a problem in that the conductive wire is easily cut off.

SUMMARY

To solve the above problems, an object of the present invention is to provide a light emitting device which enables improvement of light extraction efficiency and prevention of cutting-off of the bonding wire.

As a result of the keen examination performed for the above object by the inventors, aspects of the present invention as follows are obtained.

According to a first aspect, there is provided a light emitting device which includes a heat dissipative board, a wiring board, a light-emitting element, a bonding wire, and a light-reflecting member. The wiring board adheres and is fixed to the heat dissipative board, and has a through-hole formed therein. The light-emitting element is mounted on a front surface of the heat dissipative board which is exposed through the through-hole of the wiring board. The bonding wire connects the light-emitting element and the wiring board. The light-reflecting member covers a surface of an inner peripheral wall of the through-hole excluding disposition places of the light-emitting element and the bonding wire.

In the first aspect, after the light-reflecting member for covering the surface of the inner peripheral wall of the through-hole of the wiring board is irradiated with light emitted from a side surface side of the light-emitting element, the light is reflected by the light-reflecting member and is emitted outwardly from an opening side of the through-hole of the wiring board.

For this reason, according to the first aspect, absorption of the light emitted from the side surface side of the light-emitting element by the inner peripheral wall surface of the through-hole of the wiring board can be prevented and it is possible to improve light extraction efficiency.

In the first aspect, since the light-reflecting member is not formed at disposition place for the bonding wire, the thermal stress of the light-reflecting member is not applied to the bonding wire, and thus it is possible to prevent cutting-off of the bonding wire.

According to a second aspect, in the first aspect, the light emitting device further includes a frame member and a sealing member. The frame member is arranged so as to surround the through-hole of the wiring board. The sealing member is injected into the frame member and the inside of the frame member is filled with the injected sealing member. Thus, the light-emitting element, the bonding wire, and the light-reflecting member are sealed. The light-reflecting member also covers a front surface of the wiring board disposed on the inside of the frame member.

In the second aspect, since the surface of the wiring board disposed on the inside of the frame member is covered by the light-reflecting member, absorption of light emitted from the light-emitting element by the front surface of the wiring board can be prevented and it is possible to further improve light extraction efficiency.

According to a third aspect, in the first aspect or the second aspect, minute particles of a material having high optical reflectance are dispersed and disposed in the light-reflecting member.

According to the third aspect, the optical reflectance of the light-reflecting member can be easily increased and it is possible to reliably obtain actions and advantages of the first aspect or the second aspect.

According to a fourth aspect, in the first to the third aspects, minute particles of a material having high thermal conductivity are dispersed and disposed in the light-reflecting member.

According to the fourth aspect, the thermal conductivity of the light-reflecting member can be easily increased and heat generated in the light-reflecting member by light applied from the light-emitting element is effectively dissipated. Thus, it is possible to prevent deterioration of components of the light emitting device due to overheating of the light-reflecting member.

According to a fifth aspect, in the first to the fourth aspects, a front surface of the light-reflecting member is an inclined surface having a shape which becomes wider toward the opening side of the through-hole of the wiring board.

In the fifth aspect, the light-reflecting member functions as a reflector and can cause emitted light from the light-emitting element to be applied from the opening side of the through-hole of the wiring board in one direction. Thus, it is possible to further improve light extraction efficiency.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

Figure 1:
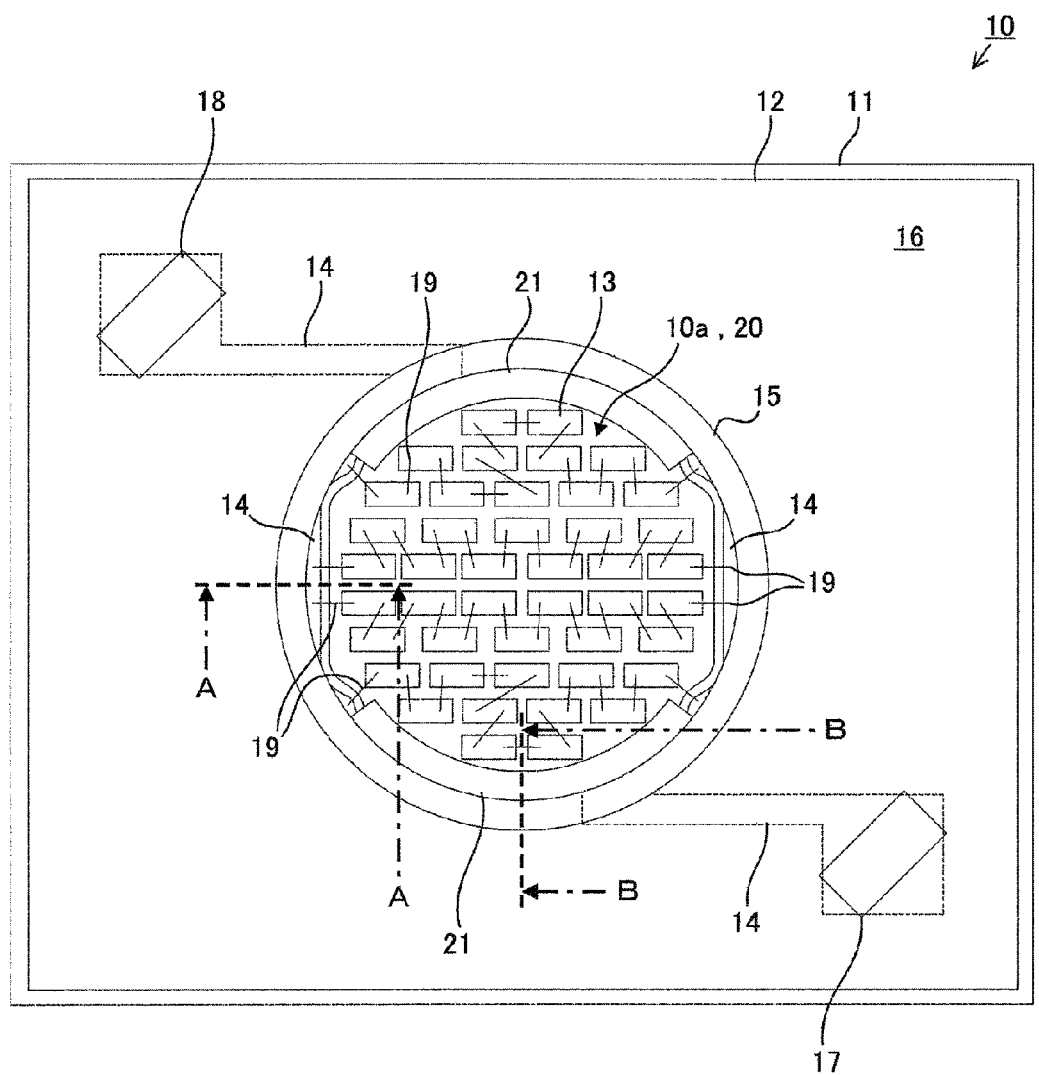
FIG. 1 is a plan view illustrating a schematic configuration of a light emitting device 10 according to an embodiment obtained by embodying the present invention.

Hereinafter, an embodiment obtained by embodying the present invention will be described with reference to the drawings.

In the drawings, in order to facilitate understanding of descriptions, dimensions, shapes, and disposition places of components are schematically illustrated with exaggeration and the dimensions, shapes, and disposition places of the illustrated components may not match with those of the realized components.

Figure 2:
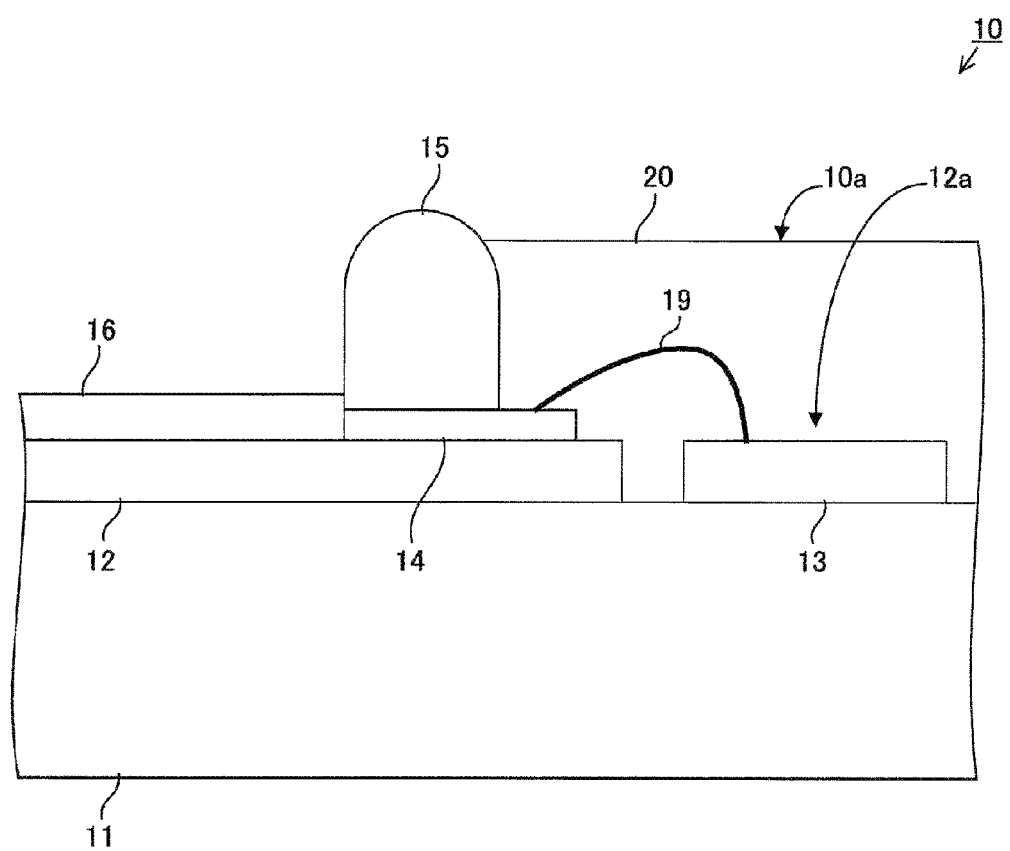
FIG. 2 is a longitudinal sectional view illustrating the schematic configuration of the light emitting device 10 and is a sectional view taken along line A-A which is indicated by arrows and illustrated in FIG. 1.
Figure 3:
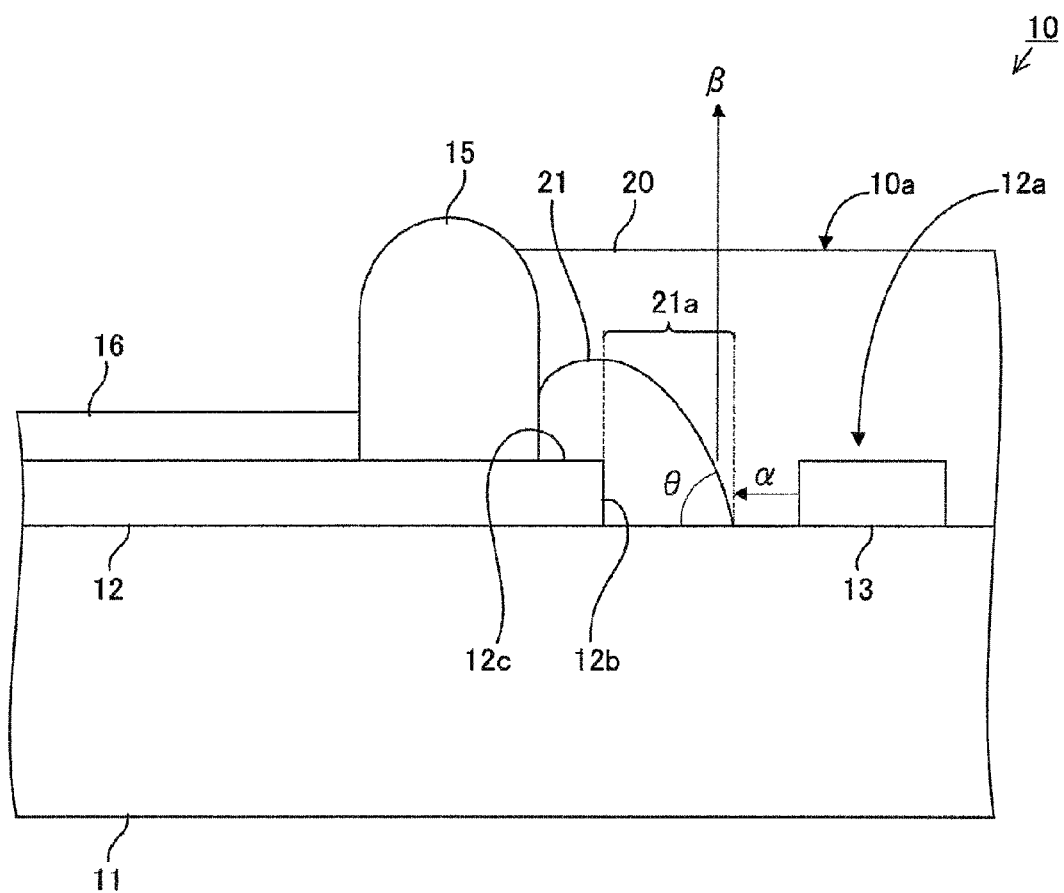
FIG. 3 is a longitudinal sectional view illustrating the schematic configuration of the light emitting device 10 and is a sectional view taken along line B-B which is indicated by arrows and illustrated in FIG. 1.

As illustrated in FIGS. 1 to 3, the light emitting device 10 according to this embodiment includes a light-reflecting surface 10a, a heat dissipative board 11, a wiring board 12 (through-hole 12a, inner peripheral wall surface 12b, and front surface 12c), a light emitting diode (LED) chip 13, a wiring layer 14, a frame member 15, an insulating layer 16, an anode electrode 17, a cathode electrode 18, a bonding wire 19, a sealing member 20, a light-reflecting member 21 (inclined portion 21a, angle θ), and the like.

The heat dissipative board (support member, and base) 11 is formed by a rectangular flat plate member. The rectangular flat plate member is formed of a metallic material (for example, aluminium alloys, pure steel, copper alloys, and the like of which high reflection treatment is performed on a surface) which has high thermal conductivity and high optical reflectance.

The material of the heat dissipative board 11 is not limited to the metallic material and the heat dissipative board 11 may be formed of any material having high thermal conductivity and high optical reflectance (for example, a synthetic resin material, a ceramics material, and the like).

The wiring board (wiring plate, insulating plate, and insulating layer) 12 adheres and is fixed to the front surface of the heat dissipative board 11. The through-hole 12a is formed in the wiring board 12.

The through-hole 12a is formed to penetrate at an angle of 90° to the front and back surfaces of the wiring board 12.

The wiring board 12 is formed, for example, by a composite board of a synthetic resin material (for example, epoxy resin, phenol resin, and the like) and a base material (for example, glass fiber, paper, and the like), and a rectangular flat plate member formed of a ceramics material (for example, aluminium nitride, and the like). The synthetic resin material has high insulating properties and the composite board is, for example, a glass-epoxy board, a paper-phenol board, and the like.

The LED chip 13 is a bare chip formed so as to have an approximately rectangular parallelepiped shape. Plural pieces (44 pieces in the illustrated example) of LED chips 13 are mounted and loaded on the front surface of the heat dissipative board 11, which is exposed through the through-hole 12a, by using a chip-on-board (CoB) method.

The LED chip 13 may be substituted with any semiconductor light-emitting element (for example, EL (ElectroLuminescence) element and the like).

The wiring layer 14 is formed of a copper foil and is formed on the front surface (surface on an opposite side of a surface which adheres and is fixed to the heat dissipative board 11) of the wiring board 12.

The circular frame member (dam member) 15 is arranged on the front surface of the wiring board 12 so as to surround the through-hole 12a of the wiring board 12.

The frame member 15 is formed, for example, by a white synthetic resin material (for example, silicone resin, epoxy resin, phenol resin, and the like), a ceramics material (for example, aluminium oxide and the like) having high optical reflectance, and a metallic material (for example, aluminium alloys and the like) having high optical reflectance. In the synthetic resin material, minute particles (for example, titanium oxide, aluminium oxide, boron nitride, aluminium nitride, barium sulfate, and the like) having high optical reflectance are dispersed and disposed.

The insulating layer 16 is formed of a synthetic resin material having insulating properties and is formed at an outer side portion of the frame member 15 on the front surface of the wiring board 12.

A portion of the wiring layer 14, which is formed on an outside of the frame member 15 is exposed from the insulating layer 16. The anode electrode (positive side electrode) 17 and the cathode electrode (negative side electrode) 18 of the light emitting device 10 are formed by the wiring layer 14 exposed from the insulating layer 16.

A portion of the wiring layer 14 is exposed from the inside of the frame member 15.

The bonding wire 19 is formed from a metal wire having high conductivity. The bonding wire 19 causes the LED chips 13 to be connected in series to each other and is connected to the wiring board 12 through the wiring layer 14 exposed from the inside of the frame member 15.

The sealing member 20 is injected into the frame member 15 and the frame member 15 is filled with the sealing member 20. Each of the LED chips 13, each of the bonding wires 19, and the light-reflecting member 21 are sealed by the sealing member 20 and are buried in the sealing member 20.

The sealing member 20 is formed by using a transparent synthetic resin material (for example, silicone resin and the like) which contains phosphors (for example, YAG (Yttrium Aluminum Garnet) and the like).

The front surface of the sealing member 20 is set as a light-reflecting surface (light-radiating area, light-emitting area, light-emitting portion) 10a of the light emitting device 10.

The light-reflecting member 21 is formed on the front surface of the heat dissipative board 11 (see FIG. 3) so as to cover the inner peripheral wall surface 12b of the through-hole 12a of the wiring board 12 and the front surface 12c of the wiring board 12 disposed on the inside of the frame member 15 excluding disposition places of the LED chips 13 and the bonding wires 19 (see FIG. 2).

The inclined portion 21a of the light-reflecting member 21 is formed from a portion covering the through-hole 12a in the light-reflecting member 21. The front surface of the inclined portion 21a is set as an inclined surface having a shape which becomes wider toward an opening side of the through-hole 12a of the wiring board. An angle $\theta$ of the inclined surface to the front surface of the heat dissipative board 11 is an acute angle.

The light-reflecting member 21 is formed by a white synthetic resin material (for example, silicone resin, epoxy resin, phenol resin, and the like) which has a low thermal expansion coefficient. In the synthetic resin material, minute particles of a material (for example, titanium oxide, aluminium oxide, boron nitride, aluminium nitride, barium sulfate, and the like) having high optical reflectance and minute particles of a material (for example, aluminium, silver, copper, and the like) having high thermal conductivity are dispersed and disposed.

As a forming method of the light-reflecting member 21, for example, a dispensing (potting) method, a screen printing method, and the like are used.

In addition, when the screen printing method is used, it is necessary that the LED chips 13 are mounted on the heat dissipative board 11 after the light-reflecting member 21 is formed.

When the dispensing method is used, the LED chips 13 may be mounted on the heat dissipative board 11 after the light-reflecting member 21 is formed or the light-reflecting member 21 may be formed after the LED chips 13 are mounted on the heat dissipative board 11 and are respectively connected to the bonding wires 19.

Actions and Advantages of Embodiment

According to the light emitting device 10 of this embodiment, it is possible to obtain the following actions and advantages.

[1] When the inner peripheral wall surface 12b of the through-hole 12a of the wiring board 12 is exposed without the provided light-reflecting member 21, since the optical reflectance of the inner peripheral wall surface 12b is low, light emitted from the side surface side of each of the LED chips 13 is absorbed by the inner peripheral wall surface 12b of the through-hole 12a of the wiring board 12. Thus, there is a problem in that light extraction efficiency is degraded.

On the contrary, in the light emitting device 10, as indicated by an arrow a in FIG. 3, light emitted from the side surface side of each of the LED chips 13 is applied to the light-reflecting member 21 which covers the inner peripheral wall surface 12b of the through-hole 12a of the wiring board 12. Then, as indicated by an arrow 13 in FIG. 3, the light is reflected by the light-reflecting member 21 and is emitted outwardly from the opening side of the through-hole 12a of the wiring board 12.

For this reason, according to the light emitting device 10, absorption of light emitted from the side surface side of each of the LED chips 13 by the inner peripheral wall surface 12b of the through-hole 12a of the wiring board 12 can be prevented, and thus it is possible to improve light extraction efficiency.

[2] When the front surface 12c of the wiring board 12 disposed on the inside of the frame member 15 is exposed without the provided light-reflecting member 21, since the optical reflectance of the front surface 12c of the wiring board 12 is low, light emitted from the side surface side of each of the LED chips 13 is absorbed by the front surface 12c of the wiring board 12. Thus, there is a problem in that light extraction efficiency is degraded.

On the contrary, in the light emitting device 10, since the front surface 12c of the wiring board 12 disposed on the inside of the frame member 15 is covered by the light-reflecting member 21, absorption of light emitted from each of the LED chips 13 by the front surface 12c of the wiring board 12 can be prevented, and thus it is possible to further improve light extraction efficiency.

[3] In a case where the bonding wire 19 is buried in the light-reflecting member 21, if the synthetic resin material having a low thermal expansion coefficient is used as the light-reflecting member 21, when the light-reflecting member 21 is heated by heat emitted by the LED chips 13, the thermal stress of the light-reflecting member 21 is applied to the bonding wire 19. Thus, there is a problem in that the bonding wire 19 is easily cut off.

On the contrary, in the light emitting device 10, since the light-reflecting member 21 is not formed at the disposition places of the bonding wires 19, the thermal stress of the light-reflecting member 21 is not applied to the bonding wire 19, and thus it is possible to prevent cutting-off of the bonding wire 19.

[4] Since the minute particles of the material having high optical reflectance are dispersed and disposed in the light-reflecting member 21, the optical reflectance of the light-reflecting member 21 can be easily increased, and thus it is possible to reliably obtain the actions and advantages of [1] and [2].

[5] Since the minute particles of the material having high thermal conductivity are dispersed and disposed in the light-reflecting member 21, the thermal conductivity of the light-reflecting member 21 can be easily increased. Since heat generated in the light-reflecting member 21 by light applied from each of the LED chips 13 is effectively dissipated, it is possible to prevent deterioration of the components (wiring board 12, LED chips 13, frame member 15, bonding wire 19, sealing member 20, and the like) of the light emitting device 10 due to the overheating of the light-reflecting member 21.

[6] The front surface of the inclined portion 21a of the light-reflecting member 21 is set as the inclined surface having a shape which becomes wider toward an opening side of the through-hole 12a of the wiring board 12. The angle θ of the inclined surface to the front surface of the heat dissipative board 11 is an acute angle.

For this reason, the front surface of the inclined portion 21a functions as a reflector and can cause emitted light from each of the LED chips 13 to be applied from the opening side of the through-hole 12a of the wiring board in one direction. Thus, it is possible to further improve light extraction efficiency.

Here, the angle θ is appropriately in a range of 5° to 85°, desirably 10° to 80°, and particularly desirably 30° to 60°.

If the angle θ is greater than the values of the range, the function of the inclined portion 21a as a reflector may be impeded.

If the angle θ is less than the values of the range, the light-reflecting member 21 applied on the inner peripheral wall surface 12b of the through-hole 12a of the wiring board 12 flows out to the heat dissipative board 11 when the light-reflecting member 21 is formed by using the dispensing method. Thus, only a portion of the inner peripheral wall surface 12b may be covered.

[7] The light-reflecting member 21 is sealed by the sealing member 20, and thus is buried in the sealing member 20. However, even when the sealing member 20 is separated from the light-reflecting member 21 and an air layer (gap) between the light-reflecting member 21 and the sealing member 20 is generated, since light emitted from the side surface side of each of the LED chips 13 is completely reflected by the air layer, light extraction efficiency is not degraded by the air layer.

The present invention is not limited to the aspects and the descriptions of the embodiment. The present invention includes various modifications within a scope which can be easily derived by the inventors without departing from the descriptions of the claims. Details of the patent documents and the like mentioned in this specification are cited by incorporating the entirety of the details.

What is claimed is:

1. A light emitting device comprising:
    a heat dissipative board;
    a wiring board which adheres and is fixed to the heat dissipative board and in which a through-hole is formed;
    a light-emitting element which is mounted on a front surface of the heat dissipative board which is exposed through the through-hole of the wiring board;
    a frame member which is arranged so as to surround the through-hole of the wiring board;
    a bonding wire which connects the light-emitting element and the wiring board; and
    a light-reflecting member which covers a surface of an inner peripheral wall of the through-hole excluding disposition places of the light-emitting element and the bonding wire,
    wherein the light-reflecting member contacts a first portion of an inner wall surface of the frame member,
    wherein a portion of the wiring board along a region of a second portion of the inner wall surface of the frame member comprises a wiring layer that is exposed from an inside of the frame member, and
    wherein the bonding wire is connected to the wiring layer exposed from the inside of the frame member.

2. The light emitting device according to claim 1, further comprising:
    a sealing member which is injected into the frame member, with which the inside of the frame member is filled, and which seals the light-emitting element, the bonding wire, and the light-reflecting member,
    wherein the light-reflecting member also covers a front surface of the wiring board disposed on the inside of the frame member.

3. The light emitting device according to claim 1, wherein minute particles of a material having high optical reflectance are dispersed and disposed in the light-reflecting member.

4. The light emitting device according to claim 1, wherein minute particles of a material having high thermal conductivity are dispersed and disposed in the light-reflecting member.

5. The light emitting device according to claim 1, wherein a front surface of the light-reflecting member comprises an inclined surface having a shape which becomes wider toward the opening side of the through-hole of the wiring board.

6. The light emitting device according to claim 1, wherein the first portion and the second portion of the inner wall surface of the frame member comprise an entirety of the inner wall surface of the frame member.

7. The light emitting device according to claim 1, further comprising a second light-reflecting member which contacts a third portion of the inner wall surface of the frame member,
    wherein the region of the second portion comprising the wiring layer that is exposed from the inside of the frame member is disposed inside the frame member and between the first portion and the third portion of the inner wall surface.

8. The light emitting device according to claim 1, wherein an entirety of an outer surface of the light-reflecting member is flush with the inner surface of the frame member.

9. The light emitting device according to claim 1, wherein a first distance from a center of the heat dissipative board to a connection point of the bonding wire on the wiring layer is less than a second distance from the center of the heat dissipative board to an outer peripheral wall of the light-reflecting member.

10. The light emitting device according to claim 5, wherein an angle of the inclined surface of the front surface of the light-reflecting member is in a range of 5 degrees to 85 degrees.

11. The light emitting device according to claim 5, wherein an angle of the inclined surface of the front surface of the light-reflecting member is in a range of 10 degrees to 80 degrees.

12. The light emitting device according to claim 5, wherein an angle of the inclined surface of the front surface of the light-reflecting member is in a range of 30 degrees to 60 degrees.

* * * * *